(12) United States Patent
Yokoyama et al.

(10) Patent No.: US 7,884,545 B2
(45) Date of Patent: Feb. 8, 2011

(54) LED LIGHT SOURCE AND METHOD FOR ADJUSTING CHROMATICITY OF LED LIGHT SOURCE

(75) Inventors: Masafumi Yokoyama, Tokyo (JP); Keisuke Sakai, Matsudo (JP)

(73) Assignee: Citizen Holdings Co., Ltd., Tokyo (JP)

( * ) Notice: Subject to any disclaimer, the term of this patent is extended or adjusted under 35 U.S.C. 154(b) by 135 days.

(21) Appl. No.: 12/410,079

(22) Filed: Mar. 24, 2009

(65) Prior Publication Data
US 2009/0236967 A1 Sep. 24, 2009

(30) Foreign Application Priority Data
Mar. 24, 2008 (JP) .............................. 2008-075642

(51) Int. Cl.
*H01J 1/62* (2006.01)
(52) U.S. Cl. ........................ 313/512; 313/501; 313/503
(58) Field of Classification Search ......... 313/501–512; 498/690; 252/301.4 R
See application file for complete search history.

(56) References Cited

FOREIGN PATENT DOCUMENTS

JP          2004-186488          7/2004

*Primary Examiner*—Joseph L Williams
(74) *Attorney, Agent, or Firm*—Finnegan, Henderson, Farabow, Garrett & Dunner, L.L.P.

(57) ABSTRACT

The present invention is directed to the provision of an LED light source that can easily adjust its chromaticity and a chromaticity adjustment method for such an LED light source. More specifically, the invention provides a chromaticity adjustment method for an LED light source having an LED device, a phosphor which absorbs a portion of light emitted from the LED device and emits light by wavelength conversion, and a resin material containing the phosphor and disposed so as to enclose the LED device, wherein an ink coating layer is disposed on a surface of the resin material in order to adjust chromaticity; the invention also provides an LED light source adjusted in such a manner.

12 Claims, 16 Drawing Sheets

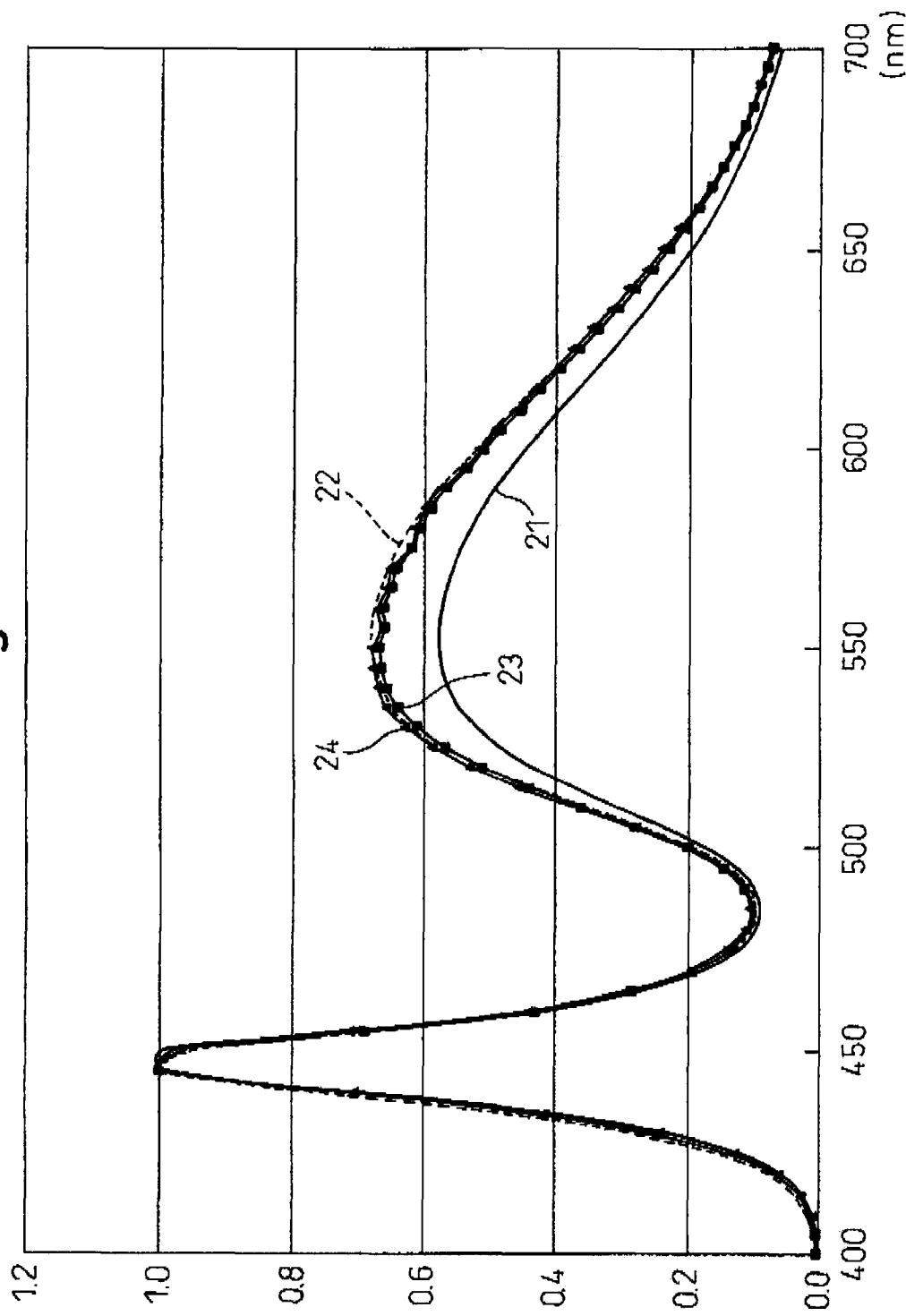

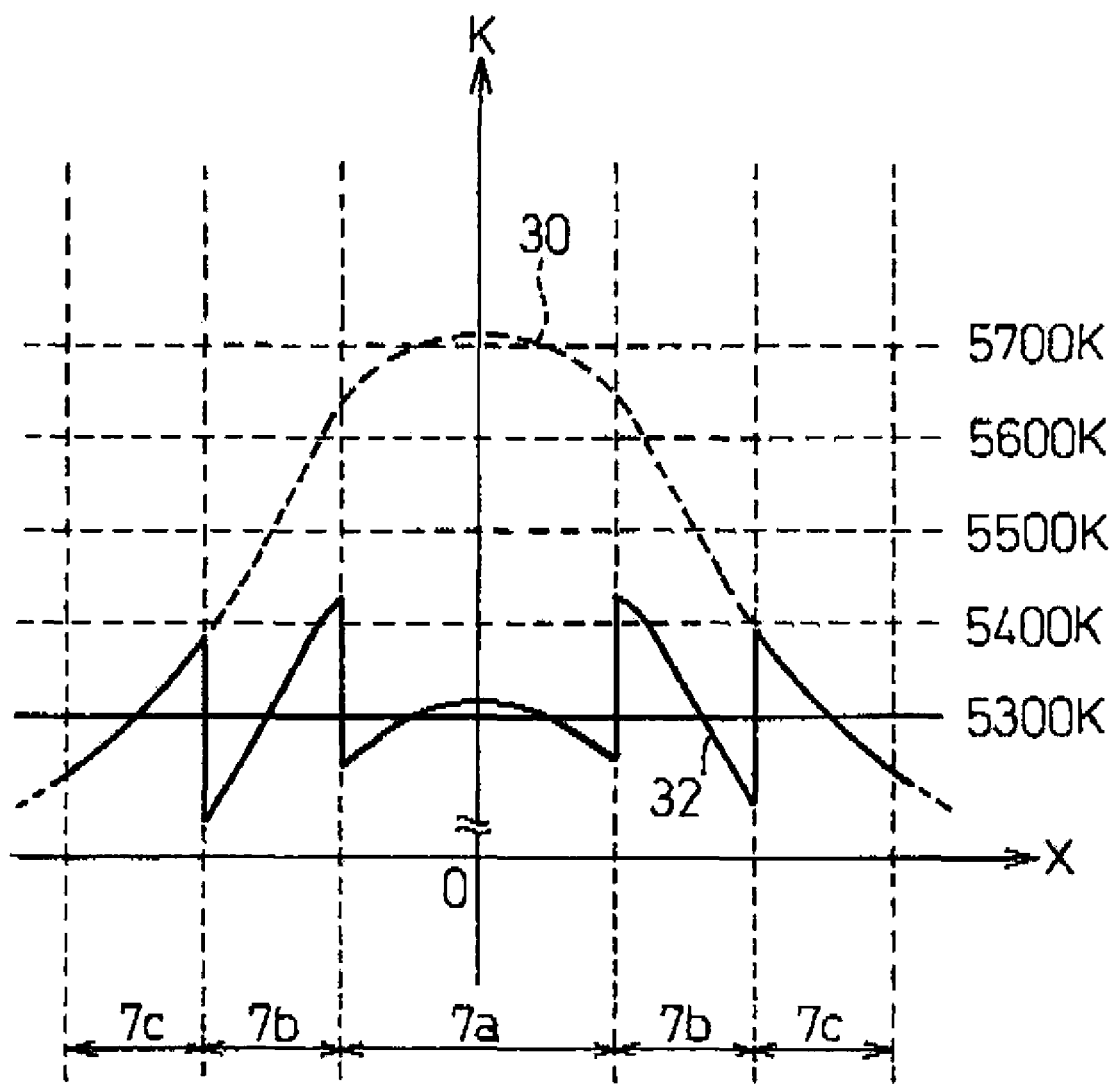

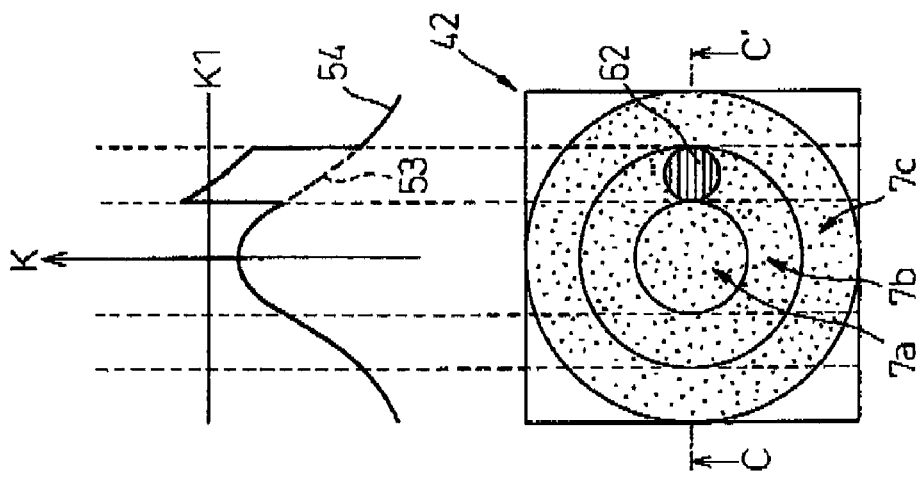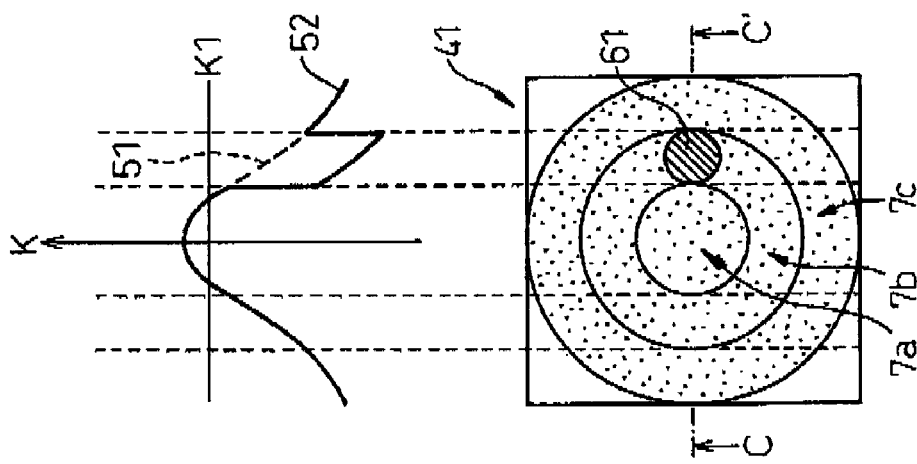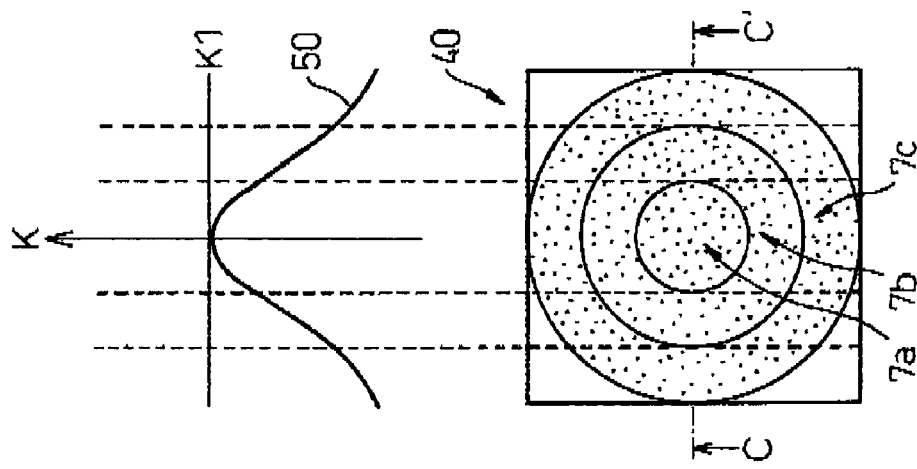

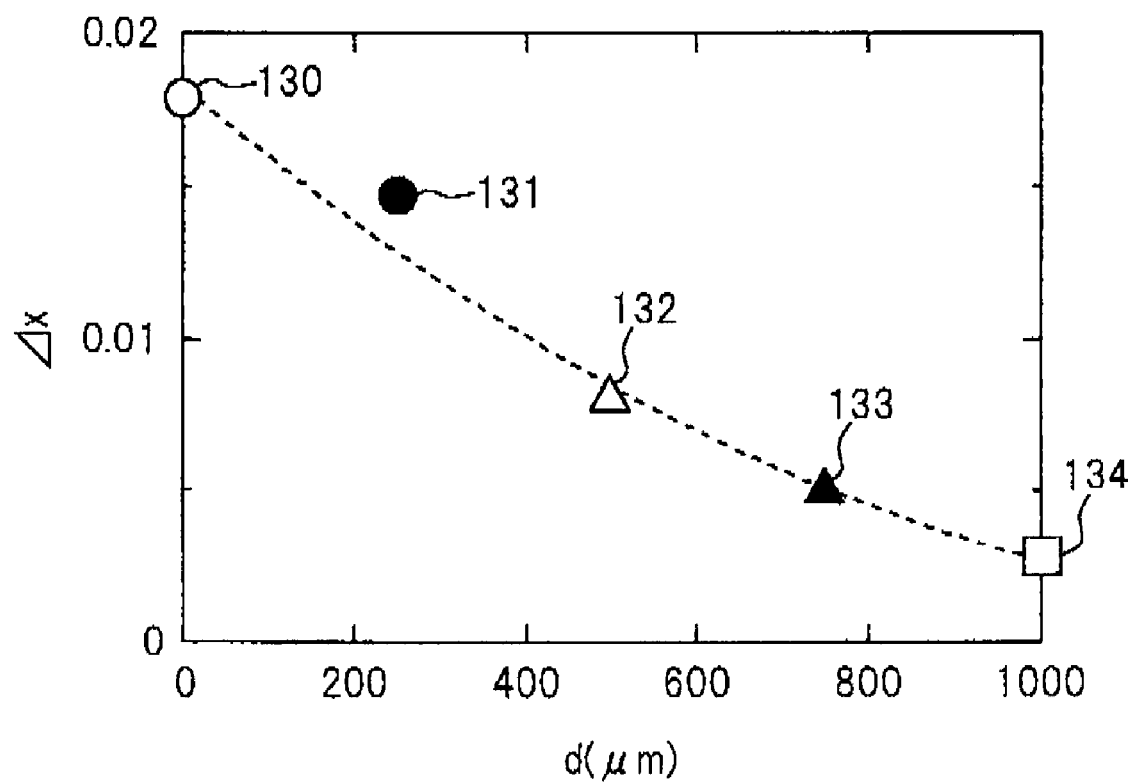

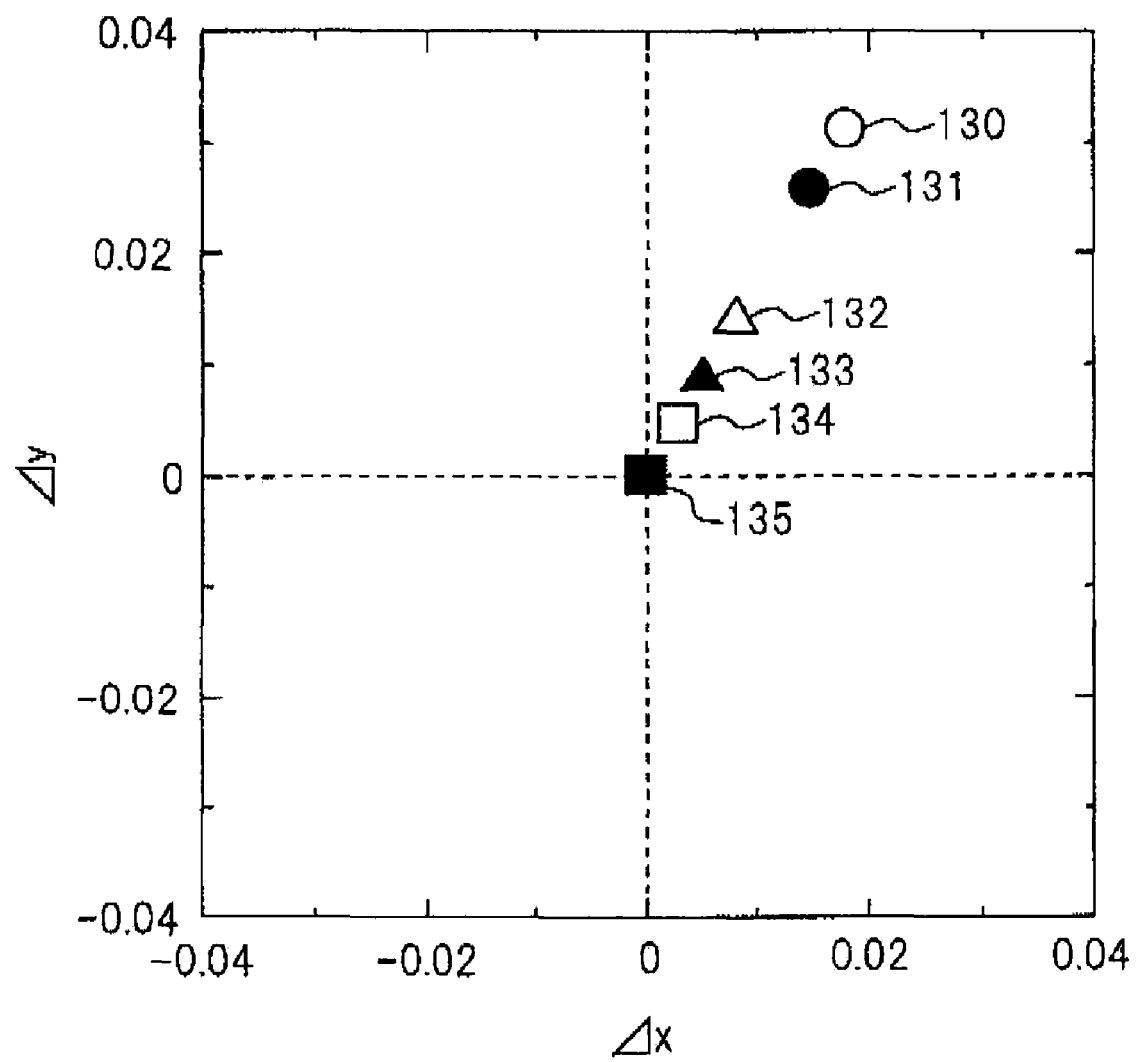

LED LIGHT SOURCE AND METHOD FOR ADJUSTING CHROMATICITY OF LED LIGHT SOURCE

This application claims priority of Japanese Application No. 2008-075642, filed Mar. 24, 2008, the content of the Japanese Application No. 2008-075642 is incorporated herein by reference.

FIELD OF THE INVENTION

The present invention relates to an LED light source and a chromaticity adjustment method for an LED light source, and more particularly to a chromaticity adjustment method for an LED light source that adjusts the chromaticity by using an ink coating layer.

BACKGROUND OF THE INVENTION

Generally, an LED light source constructed by combining an LED device with a resin containing a phosphor that absorbs a portion of the light emitted from the LED device and emits light at a different wavelength has had the problem that the chromaticity of the LED light source varies due to such factors as variations in the wavelength of the LED device itself and variations in phosphor content.

In view of this, an attempt has been made to suppress the variation of the chromaticity of the LED light source by varying the amount of the resin used to seal the LED device (refer, for example, to patent document 1).

FIG. 16 is a cross-sectional view of the above prior art LED light source.

In the LED light source 210 shown in FIG. 16(a), the LED device 211 is mounted on a substrate comprising a base material 212 and conductive interconnections 213, and is electrically connected to the conductive interconnections 213 via bonding wires 214. The interior space enclosed by a reflective frame 215 mounted on the substrate is filled with a seal material. The seal material is cured by allowing phosphors 216 to settle to the bottom while leaving the portion thereabove filled only with a transparent resin 217.

FIG. 16(a) shows an example in which the transparent resin 217 in the upper part has been ground until target chromaticity is reached in the chromaticity adjustment process. In the example of FIG. 16(a), the initial resin surface position 218 has been reduced to the position 219 by grinding the resin surface. In this case, since light is confined within a narrower space (in the transparent resin), the light undergoes many more reflections, and the probability of the phosphors 216 being struck by the light from the LED device 211 increases, thus increasing the wavelength conversion rate. As a result, the chromaticity of the LED light source 210 is adjusted from the blue to yellow regions.

In the LED light source 220 shown in FIG. 16(b), the same parts as those of the LED light source 210 shown in FIG. 16(a) are designated by the same reference numerals. FIG. 16(b) shows an example in which the initial resin surface position 218 has been raised to the position 221 in the chromaticity adjustment process by further applying a resin over the initial surface. In the example of FIG. 16(b), since the amount of resin is increased, the light passes through a wider space (in the transparent resin), and the probability of the phosphors being struck by the light from the LED device 211 decreases, thus decreasing the wavelength conversion rate. As a result, the chromaticity of the LED light source 220 is adjusted from the yellow to blue regions.

In this way, the chromaticity can be adjusted by simply increasing or decreasing the amount of the transparent resin. However, in applications that impose limitations on the external shape of the LED light source, it has been difficult to increase or decrease the amount of the transparent resin. Furthermore, when grinding is performed, the LED light source may be damaged due to the applied force or scratches, leading to problems such as a break in the wire bonding or scratches on the reflective frame.

Further, with the prior art chromaticity adjustment method, the color temperature of the light emerging from the LED light source may vary depending on the angle of emergence. That is, the prior art has had the problem that the light from the LED device, when viewed straight on, for example, appears bluish, but as the viewing angle is changed, the light appears yellowish.

Patent document 1: Japanese Unexamined Patent Publication No. 2004-186488 (page 2, FIG. 1)

SUMMARY OF THE INVENTION

It is an object of the present invention to provide an LED light source and a chromaticity adjustment method for an LED light source that can solve the above problems.

It is another object of the present invention to provide an LED light source that can easily adjust its chromaticity and a chromaticity adjustment method for such an LED light source.

It is a further object of the present invention to provide an LED light source that can easily adjust the color temperature of the emergent light and a chromaticity adjustment method for such an LED light source.

In a chromaticity adjustment method for an LED light source according to the present invention, the LED light source includes an LED device, a phosphor which absorbs a portion of light emitted from the LED device and emits light by wavelength conversion, and a resin material containing the phosphor and disposed so as to enclose the LED device, wherein an ink coating layer is disposed on a surface of the resin material in order to adjust chromaticity.

Preferably, the chromaticity adjustment method for the LED light source according to the present invention further includes the step of dividing the surface of the resin material into a plurality of regions and disposing the ink coating layer in each region selected from among the plurality of regions, in order to correct the color temperature of the light emerging from the LED light source.

Preferably, the chromaticity adjustment method for the LED light source according to the present invention further includes the step of measuring the chromaticity of the light emerging from the LED light source and disposing the ink coating layer so as to be displaced along the surface of the resin material in accordance with the measured chromaticity.

An LED light source according to the present invention comprises an LED device, a phosphor which absorbs a portion of light emitted from the LED device and emits light by wavelength conversion, a resin material containing the phosphor and disposed so as to enclose the LED device, and an ink coating layer disposed on a surface of the resin material in order to adjust chromaticity.

In the light emitting apparatus according to the present invention, more than one kind of phosphor or scattering agent is substantially uniformly mixed into the resin material covering the LED device contains, and the surface of the resin material, when viewed from the top of the light emitting apparatus, is divided into a plurality of regions, of which each designated region is coated with pigmented ink. Preferably, the coating density of the pigmented ink varies from one region to another.

Preferably, in the light emitting apparatus according to the present invention, the method of varying the coating density of the pigmented ink involves dividing the surface of the resin material into a plurality of concentric regions centered about the LED device and varying the coating area ratio of the pigmented ink or the number of coatings from one region to another.

Preferably, in the light emitting apparatus according to the present invention, the pigmented ink coating method is an inkjet method, and the pigmented ink is at least one kind of ink selected from among cyan, yellow, magenta, red, green, and blue inks.

According to the present invention, by forming the ink coating layer, it is possible to provide an LED light source that can easily adjusts its chromaticity without having to virtually change its outer shape and without suffering much damage during the chromaticity adjustment process.

Furthermore, according to the present invention, by forming the ink coating layer, it is possible to provide an LED light source that can easily accomplish the chromaticity adjustment so that the color temperature of the emergent light becomes substantially uniform regardless of the angle of emergence.

BRIEF DESCRIPTION OF THE DRAWINGS

These and other features and advantages of the present invention will be better understood by reading the following detailed description, taken together with the drawings wherein:

FIG. 8 is a graph showing the wavelengths of the light rays emerging from the LED light source 20 at various angles;

FIG. 9 is a diagram explaining how the chromaticity is adjusted in the LED light source 20;

FIG. 10(a) shows a color temperature profile and a top view of an LED light source 40 when no pigmented ink whatsoever is applied to its surface, FIG. 10(b) shows a color temperature profile and a top view of an LED light source 41 when yellow pigmented ink is applied, and FIG. 10(c) shows a color temperature profile and a top view of an LED light source 42 when cyan pigmented ink is applied;

FIG. 14 is a diagram showing the relationship between the amount of displacement (d) and the amount of chromaticity correction $\Delta x$;

FIG. 15 is a diagram showing examples of chromaticity coordinates; and

DETAILED DESCRIPTION OF THE PREFERRED EMBODIMENT

An LED light source and a chromaticity adjustment method for an LED light source according to the present invention will be described below with reference to the drawings. It should, however, be noted that the technical scope of the present invention is not limited to the specific embodiments described herein, but extends to the inventions described in the appended claims and their equivalents.

Figure 1:
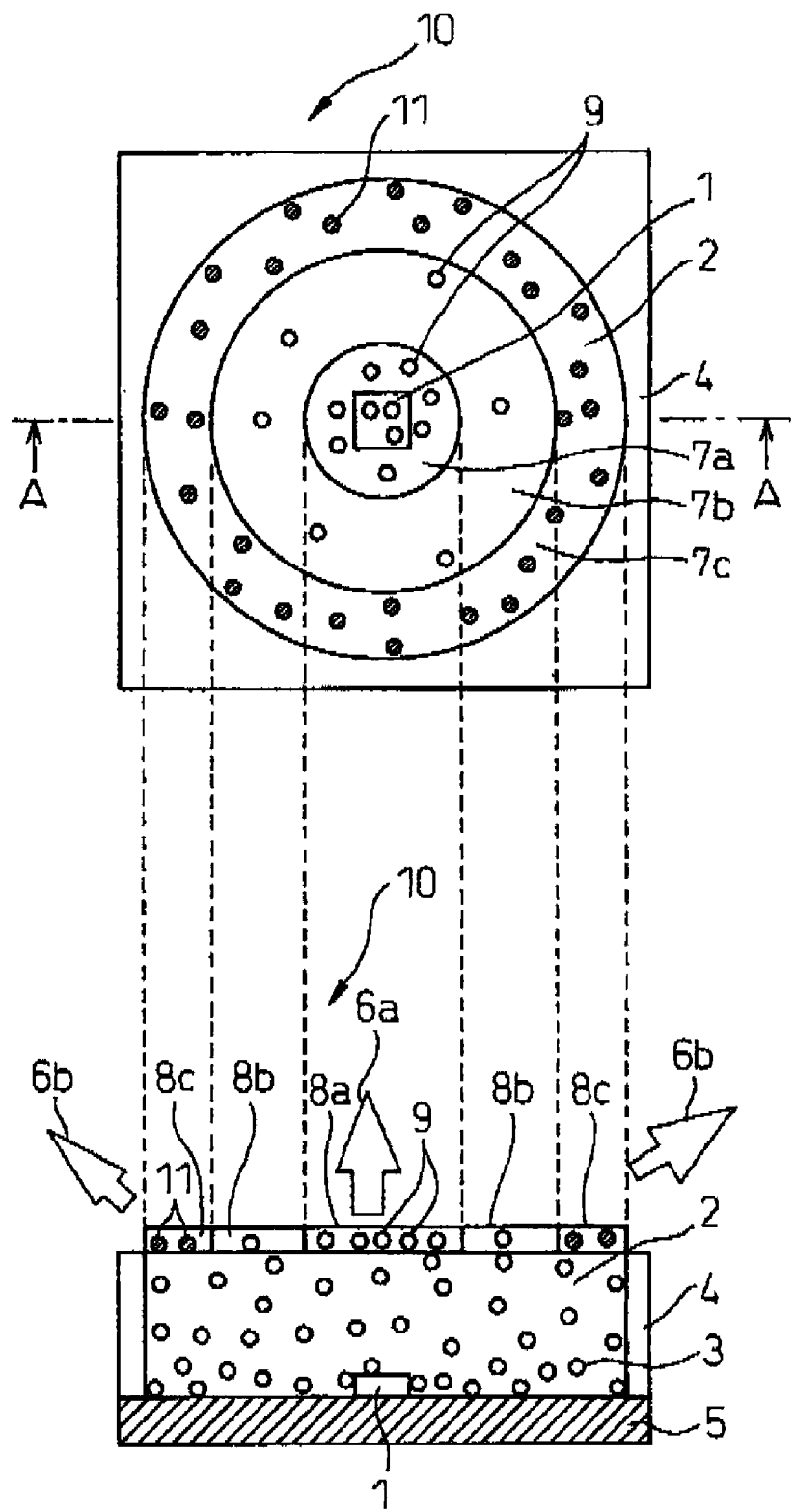
FIG. 1 is a diagram showing, by way of example, a top view and a cross-sectional view of an LED light source 10 according to the present invention.

FIG. 1 is a diagram showing, by way of example, a top view and a cross-sectional view of an LED light source 10 according to the present invention. The cross-sectional view shown at the bottom is a view taken along line AA' in the view shown thereabove (the top view of the LED light source 10).

In the LED light source 10, an LED device 1 is die-bonded to electrodes (not shown) formed on a substrate 5, and the anode and cathode of the LED device 1 are tied to the electrodes by wires. A transparent resin 2 with phosphors 3 uniformly mixed therein is embedded inside a package frame 4 in such a manner as to enclose the LED device 1. The LED light source 10 generally emits light rays in all directions, ranging from a light ray 6a emerging in the straight forward direction to a light ray 6b emerging at an angle of 60° relative to the straight forward direction.

In the LED light source 10, the LED device 1 is constructed using a nitride-based compound semiconductor that emits blue light, and the phosphors 3 used here are cerium-activated yttrium aluminum garnet (YAG) phosphors. That is, the phosphors 3 absorb a portion of the light emitted from the LED device 1, and emit yellow light by wavelength conversion. The LED light source 10 thus creates white light for emission by mixing the blue light from the LED device 1 with the yellow light that the phosphors 3 emit when struck by the blue light from the LED device 1.

The resin surface of the LED light source 10 is divided into regions 7a, 7b, and 7c, each of which is coated with pigmented ink of a given density which differs from region to region. That is, an ink coating layer 8a is disposed in the region 7a, an ink coating layer 8b in the region 7b, and an ink coating layer 8c in the region 7c. The ink coating layer disposed in each region and its effect will be described in detail later.

Figure 2:
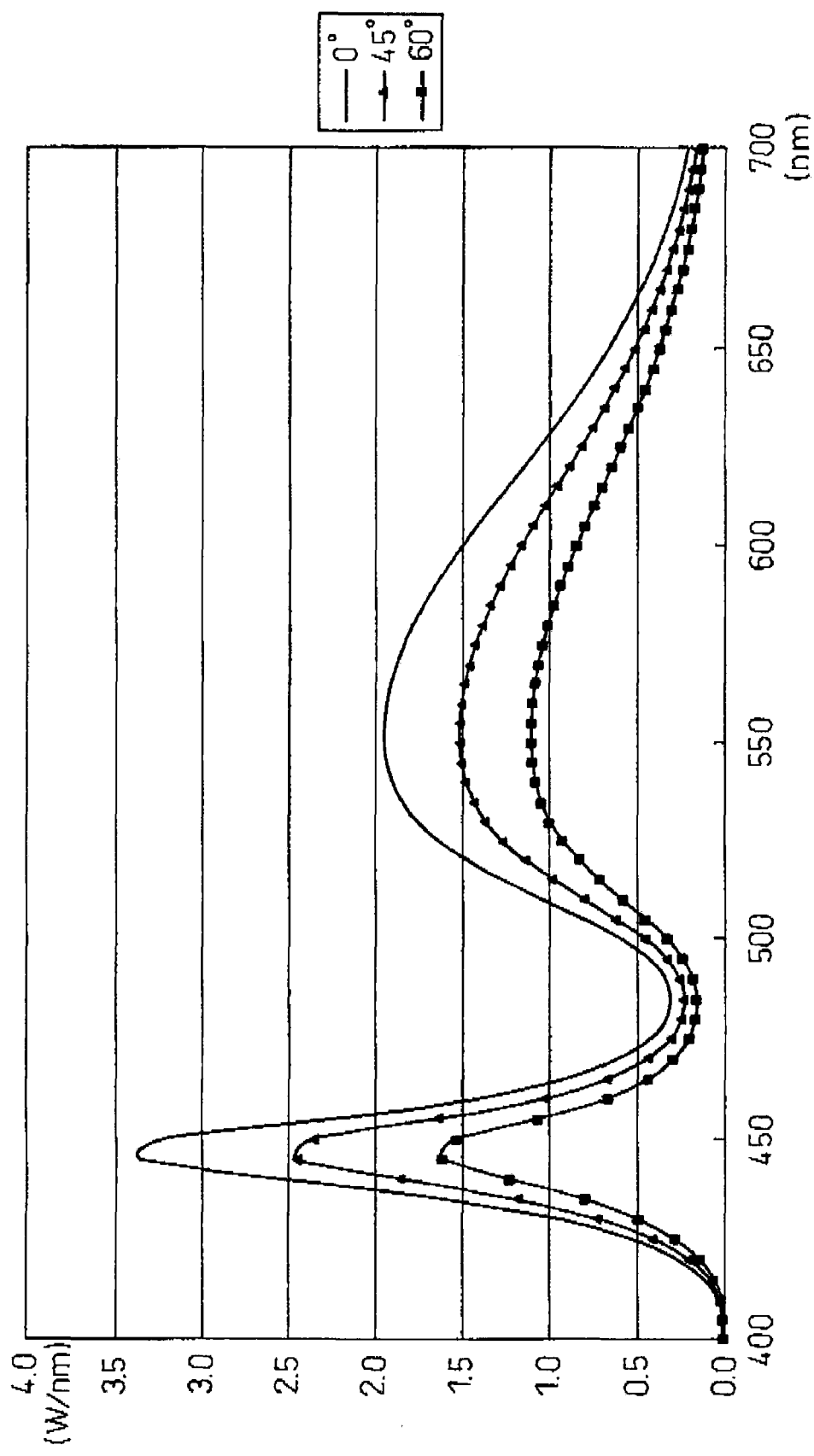
FIG. 2 is a graph showing the wavelengths of the light rays emerging from the LED light source 10 at various angles before the chromaticity is adjusted.

FIG. 2 is a graph showing the wavelengths of the light rays emerging from the LED light source 10 at various angles before the chromaticity is adjusted.

The phrase "before the chromaticity is adjusted" means "before the regions 7a, 7b, and 7c shown in FIG. 1 are coated with pigment. In FIG. 2, the abscissa represents the emission spectrum (nm), and the ordinate represents the spectral radiant flux (W/nm). Further, in FIG. 2, the emission wavelength of the light ray 6a emerging in the straight forward direction of the LED light source 10 is indicated by a solid line, and the light ray emerging at an angle of 45° relative to the straight forward direction is indicated by a line with triangular marks, while the light ray 6b emerging at an angle of 60° relative to the straight forward direction is indicated by a line with square marks.

Figure 3:
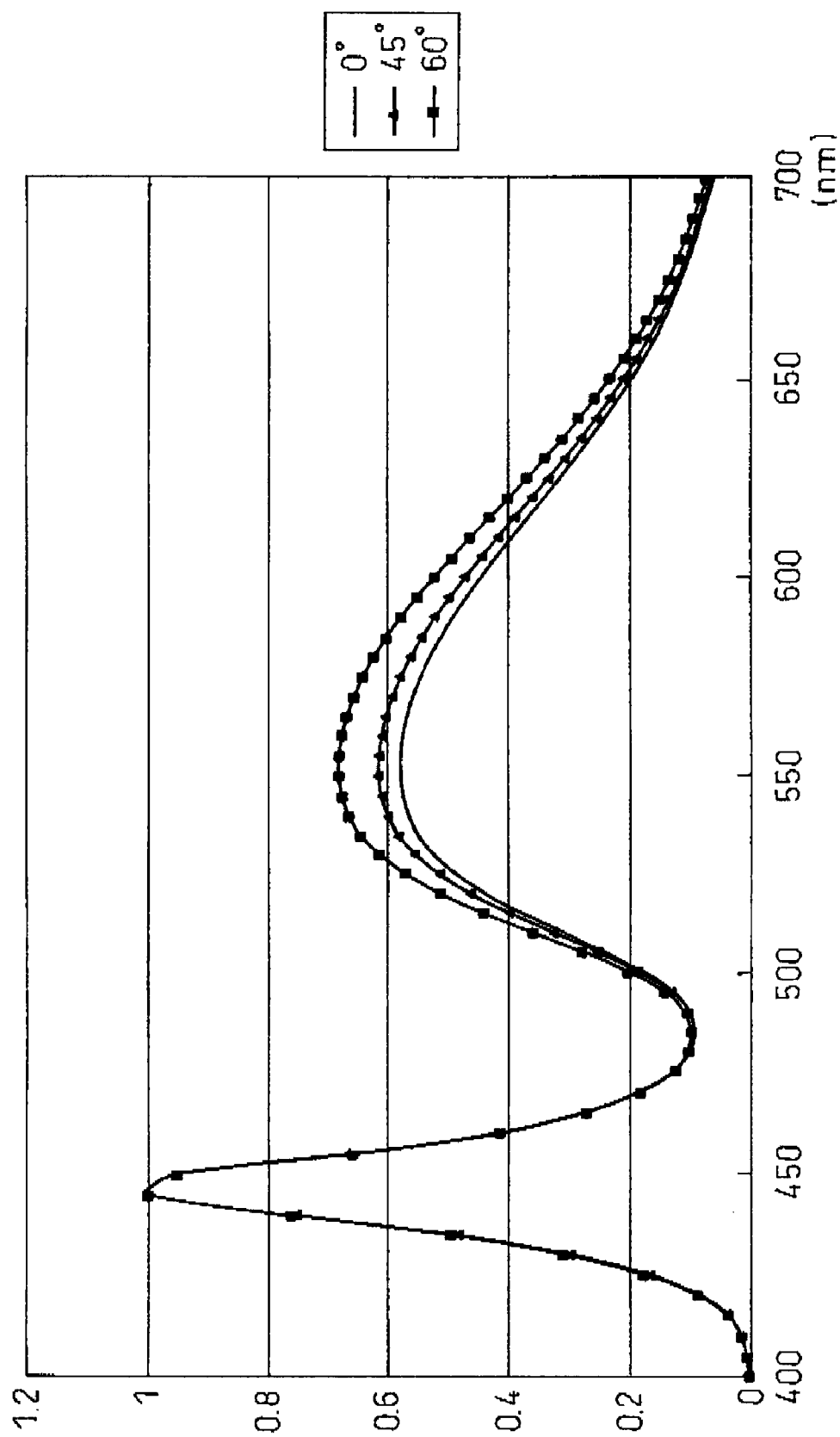
FIG. 3 is a graph constructed by normalizing the graph of FIG. 2 by setting the maximum value of spectral radiant flux to 1.

FIG. 3 is a graph constructed by normalizing the graph of FIG. 2 by setting the maximum value of the spectral radiant flux to 1.

In FIG. 3, the abscissa represents the emission spectrum (nm), and the ordinate represents the ratio of the spectral radiant flux. The data shown in FIGS. 2 and 3 were obtained by making measurements while rotating the LED light source 10 in a given direction (for example, counterclockwise direction) about the straight forward direction. It will, however, be noted that substantially the same data can be obtained if the LED light source 10 is rotated in an opposite direction (for example, clockwise direction) about the straight forward direction.

From FIG. 3, it can be seen that as the angle from the straight forward direction increases, the intensities of the components on the longer wavelength side apparently increase, causing the light to take on a relatively yellowish tint.

Table 1 below shows examples of the data taken by measuring the color temperature of the light emerging the LED light source 10 at various angles of emergence (°) before the chromaticity is adjusted. As shown in Table 1, the color temperature varies from 5720 K for the light emerging in the straight forward direction, i.e., at 0°, to 5300 K for the light emerging at 60°. The color temperatures were measured using an integrating sphere in accordance with the total luminous flux measurement method defined in JIS standards.

|  | Angle of emergence (°) | | | | |
| --- | --- | --- | --- | --- | --- |
|  | 0 | 15 | 30 | 45 | 60 |
| Color temperature (K) | 5720 | 5720 | 5670 | 5550 | 5300 |

Figure 4:
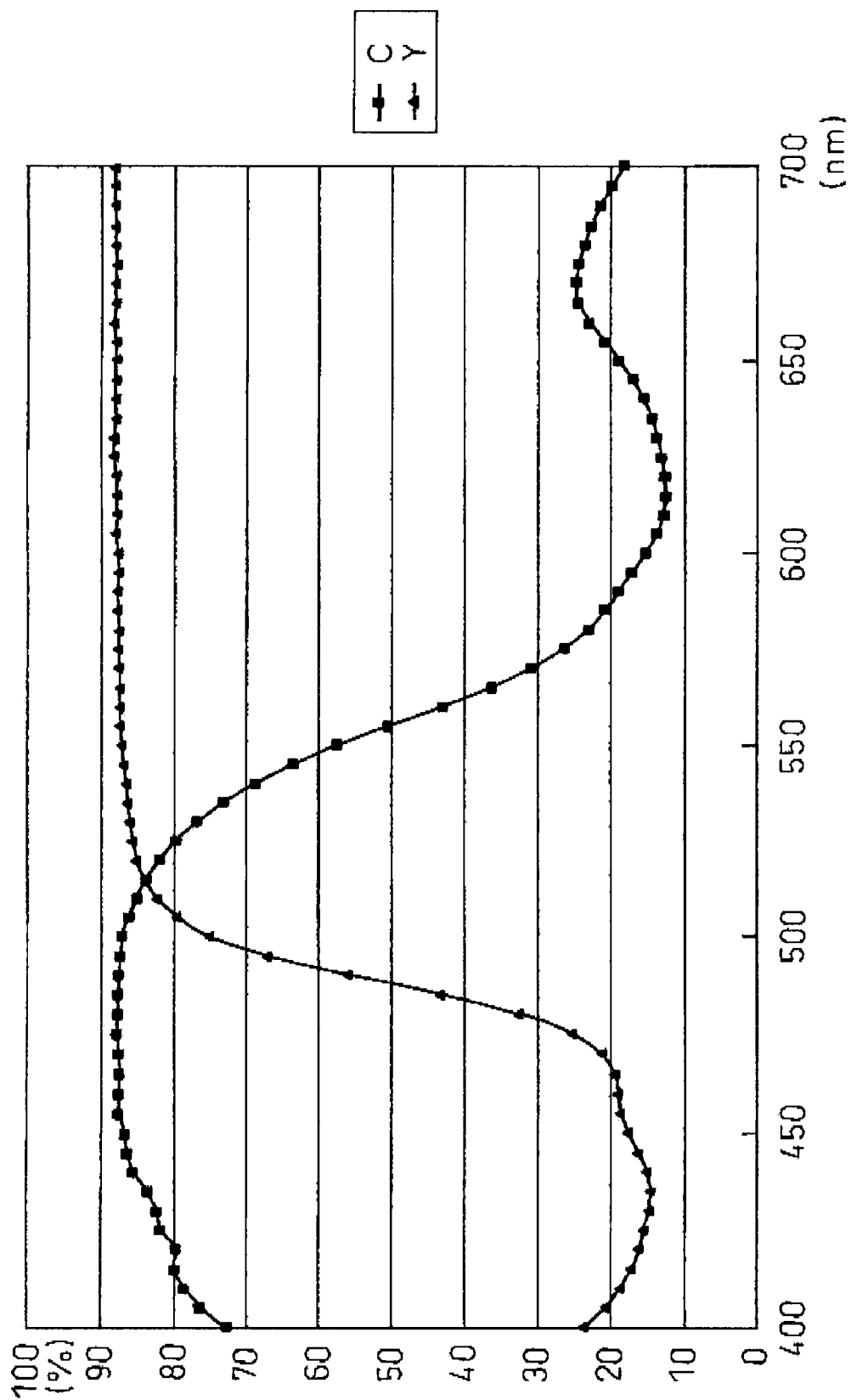
FIG. 4 is a diagram showing transmittance when the surface of the LED light source 10 is coated with a single layer of pigment.

FIG. 4 is a diagram showing transmittance when the surface of the LED light source 10 is coated with a single layer of pigment.

In FIG. 4, the abscissa represents the emission spectrum (nm), and the ordinate represents the transmittance (%). The transmittance of a cyan (C) pigment is indicated by a line with square marks, and that of a yellow (Y) pigment by a line with triangular marks.

The following description is given for the case where the chromaticity is adjusted so that the color temperature of the light emerging from the LED light source 10 becomes substantially equal to 5500 K over the emergence angle range of 0° to 60°. According to the data shown in Table 1, the color temperature of the light 6a emerging in the straight forward direction (the angle of emergence is 0°) needs to be raised, while that of the light 6b emerging at 60° needs to be lowered. Accordingly, the ink coating layer 8a containing a yellow pigment is disposed in the region 7a, and the ink coating layer 8c containing a cyan pigment is disposed in the region 7c. The region 7b is the region corresponding to the light emerging at an angle of 45°.

In FIG. 1, the ink coating layers containing the respective pigmented inks are arranged on the resin surface of the LED light source 10 in accordance with the above chromaticity adjustment method. For clarity of illustration, the phosphors 3 are not shown in the top view of FIG. 1. In FIG. 1, dots 9 indicate the yellow pigmented ink, and dots 11 the cyan pigmented ink. The dot size is exaggerated for clarity; the actual size is 20 µm or less, so that the aggregate of the dots appears like a "halftone" as described in printing terminology. The pigmented ink coating layers are printed directly on the resin surface of the LED light source by using an inkjet-type print head.

In the LED light source 10, the ratio of the coating area of the yellow pigmented ink dots 9 in the ink coating layer 8a is increased in the region 7a where the color temperature needs to be substantially lowered. On the other hand, in the region 7b where the color temperature is close to the target temperature of 5500 K, the ratio of the coating area of the yellow pigmented ink dots 9 in the ink coating layer 8b is reduced. By contrast, in the region 7c where the color temperature needs to be raised, the cyan pigmented ink dots 11 are applied to form the ink coating layer 7c. The ratio of the coating area here refers to the ratio of the pigmented ink coating area per unit area in the respected regions 7a to 7c. That is, the coating density of the yellow pigmented ink decreases and that of the cyan pigmented ink increases as the distance from the center of the LED device 1 increases toward the outer periphery of the LED light source 10 in concentric fashion.

The coating density of each pigmented ink is determined so that the color temperature is adjusted to approximately 5500 K for any angle of emergence, based on the emission wavelength distribution for each angle shown in FIG. 3, the transmittance characteristics of the pigmented inks shown in FIG. 4, and the ratio of the coating area.

In the LED light source 10, the ratio of the coating area of the yellow pigmented ink dots 9 in the ink coating layer 8a is set equal to 8% of the entire area of the region 7a, and the ratio of the coating area of the yellow pigmented ink dots 9 in the ink coating layer 8b is set equal to 1% of the entire area of the region 7b, while the ratio of the coating area of the cyan pigmented ink dots 11 in the ink coating layer 8c is set equal to 25% of the entire area of the region 7c.

Figure 5:
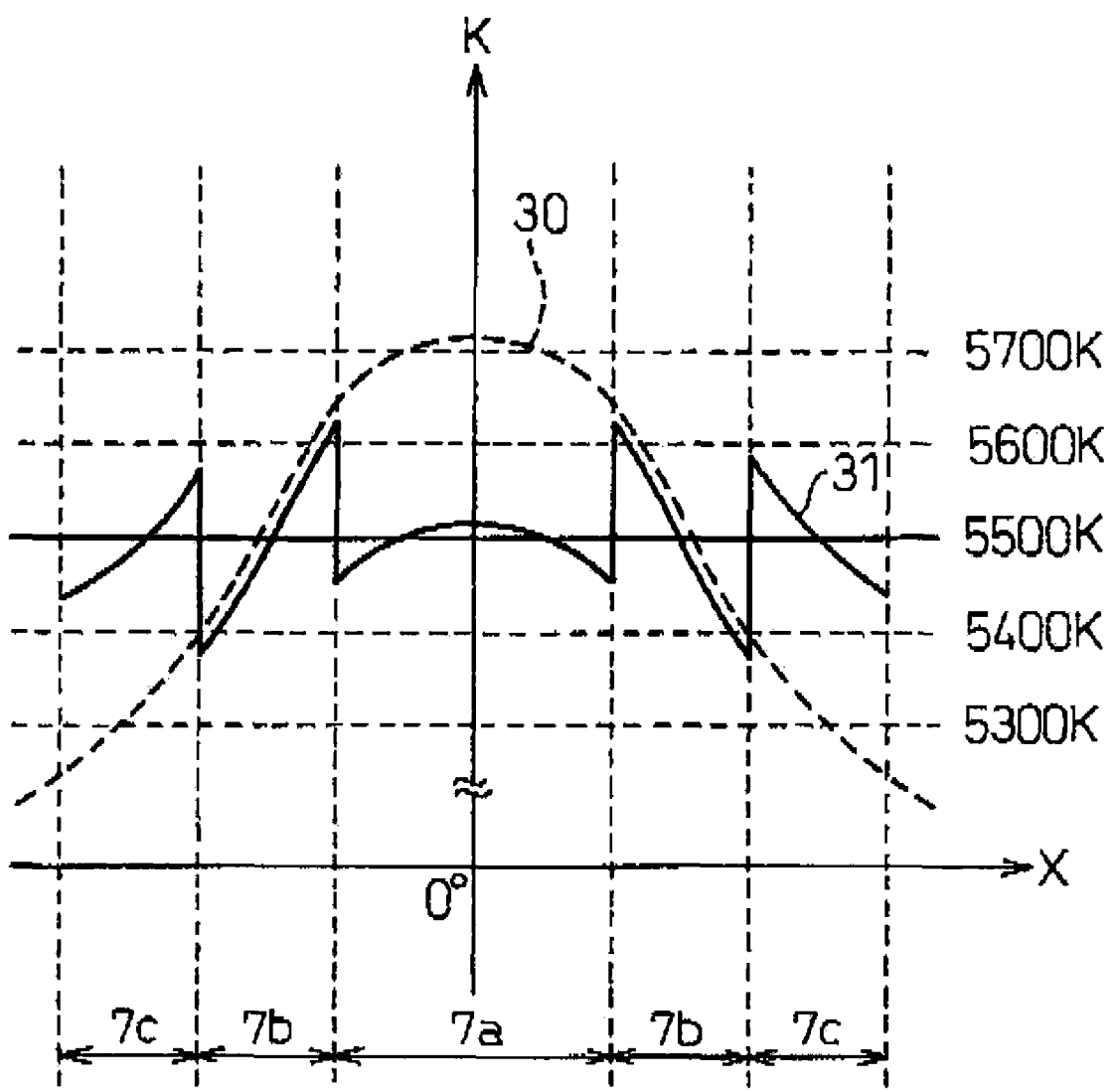
FIG. 5 is a diagram explaining how the chromaticity is adjusted in the LED light source 10.

FIG. 5 is a diagram for explaining how the chromaticity is adjusted in the LED light source 10.

In FIG. 5, the abscissa represents the position along the line AA' traversing the LED light source 10 in FIG. 1, and the origin corresponds to the position directly above the LED device 1. The ordinate in FIG. 5 represents the color temperature (K). By arranging the ink coating layers in the respective regions 7a, 7b, and 7c, as described above, the color temperature profile 30 before the chromaticity adjustment can be corrected as shown by the post-adjustment color temperature profile 31. As a result, the variation of the average color temperature due to the angle of emergence can be held within the range of ±10 K of 5500 K.

The major cause for the color temperature variation is the difference in the distance from the LED device 1 to the emergence plane. The distance from the LED device 1 to the emergence plane varies depending on the depth and surface area of the package frame 4 and the size and height of the LED device 1. In consideration of this, in the LED light source 10 shown in FIG. 1, the number of regions across which the pigmented ink coating density is varied is set to 3; however, it need not be limited to 3, but an optimum number should be selected that matches the LED light source whose chromaticity is to be adjusted.

The color temperature variation is also affected by the reflection (spectral reflectance) from the upper surface of the substrate 5 (the surface to which the LED device 1 is die-bonded). However, unless the reflectance measured in concentric circles centered about the LED device 1 on the substrate 5, as viewed from the emergence plane of the LED light source 10, is asymmetric, the regions across which the pigmented ink coating density is varied can be arranged without any problem in concentric circles centered about the LED device.

Since the major cause for the color temperature variation is the difference in the distance from the light emitting face of the LED device 1 to the emergence plane, it is desirable that the phosphors 3 mixed in the transparent resin 2 be uniformly dispersed therein in order to enhance the correlation with the distance, in other words, the correlation between the angle and the color temperature of the emergent light.

While the LED light source 10 shown in FIG. 1 has been divided into three distinct regions across which the pigmented ink coating density is varied, the number of regions may be increased so that the ratio of the coating area changes in a more gradual fashion.

Figure 6:
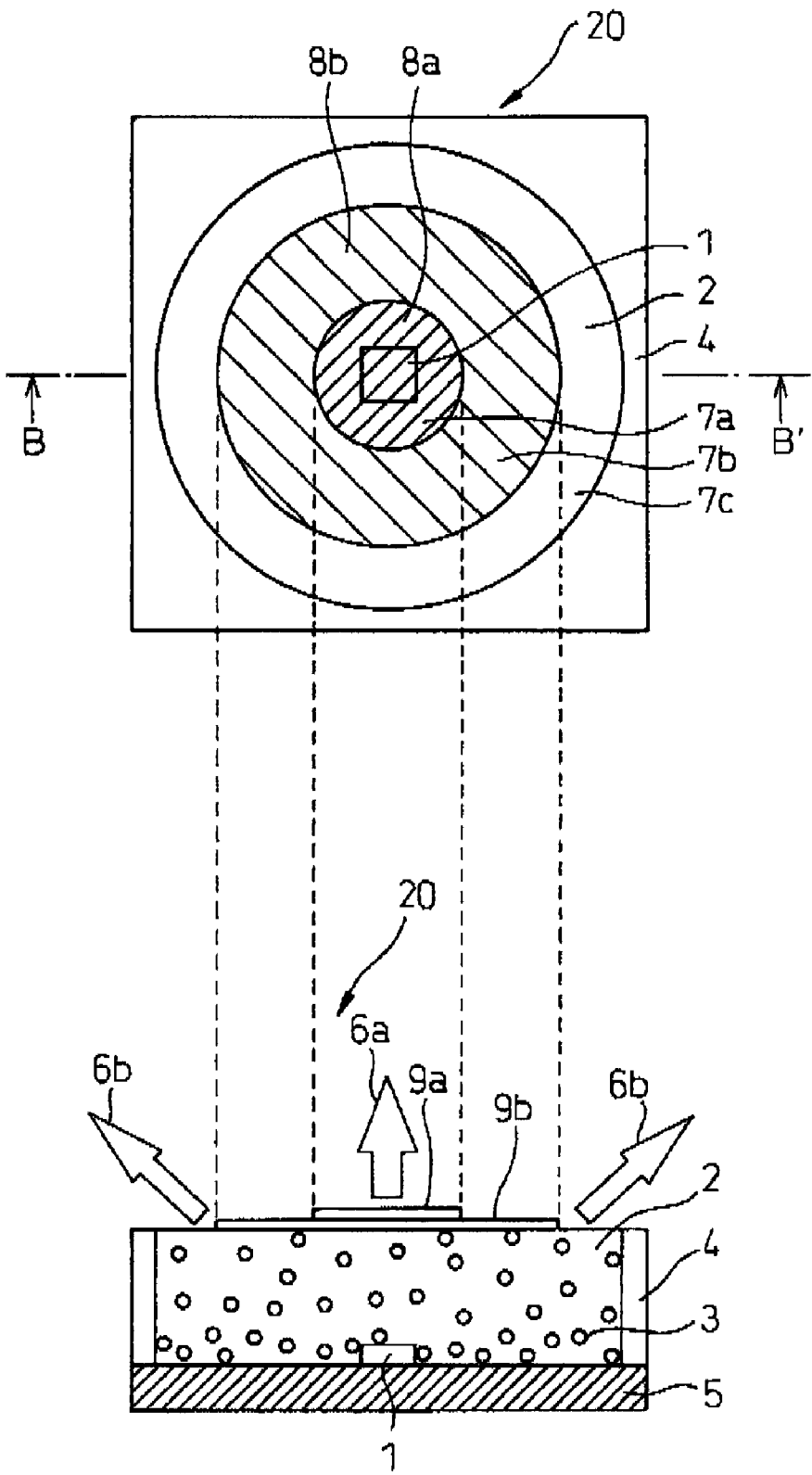
FIG. 6 is a diagram showing, by way of example, a top view and a cross-sectional view of another LED light source 20 according to the present invention.

FIG. 6 is a diagram showing, by way of example, a top view and a cross-sectional view of another LED light source 20 according to the present invention. The cross-sectional view shown at the bottom is a view taken along line BB' in the view shown thereabove (the top view of the LED light source 20).

The condition of the LED light source 20 before the chromaticity adjustment is the same as that of the above-described LED light source 10 before the chromaticity adjustment. Accordingly, the color temperatures of the various emergent light rays from the LED light source 20 before the chromaticity adjustment are the same as those shown in Table 1.

In the LED light source 20, an LED device 1 is die-bonded to electrodes (not shown) formed on a substrate 5, and the anode and cathode of the LED device 1 are tied to the electrodes by wires. A transparent resin 2 with phosphors 3 uniformly mixed therein is embedded inside a package frame 4 in such a manner as to enclose the LED device 1. The LED light source 20 generally emits light rays in all directions, ranging from a light ray 6a emerging in the straight forward direction to a light ray 6b emerging at an angle of 60° relative to the straight forward direction.

In the LED light source 20, the LED device 1 is constructed using a nitride-based compound semiconductor that emits blue light, and the phosphors 3 used here are cerium-activated yttrium aluminum garnet (YAG) phosphors. That is, the phosphors 3 absorb a portion of the light emitted from the LED device 1, and emit yellow light by wavelength conversion. The LED light source 20 thus creates white light for emission by mixing the blue light from the LED device 1 with the yellow light that the phosphors 3 emit when struck by the blue light from the LED device 1.

In FIG. 6, regions 7a, 7b, and 7c are regions dividing the transparent resin surface in concentric circles centered about the LED device 1. As earlier described, the major reason that the color temperature of the emergent light varies depending on the angle of emergence is the difference in the distance from the light emitting face of the LED device 1 to the emergence plane. It is therefore desirable that the phosphors 3 mixed in the transparent resin 2 be uniformly dispersed therein in order to enhance the correlation with the distance, in other words, the correlation between the angle and the color temperature of the emergent light.

In the LED light source 20, a coating layer 9b is formed by applying a single layer of yellow pigmented ink over the region 7b, and on top of that, a coating layer 9a is formed by applying a single layer of yellow pigmented ink over the region 7a. Accordingly, two coating layers 9a and 9b are formed in the region 7a. The yellow pigmented ink is not applied to the region 7c. The pigmented ink applied to each region and its effect will be described in detail later. In FIG. 6, the coating layers 9a and 9b are shown in such a manner as to make the number of coatings visually identifiable, but it should be noted that their actual thickness is immeasurably small compared with the thickness of the transparent rein 2, etc.

Figure 7:
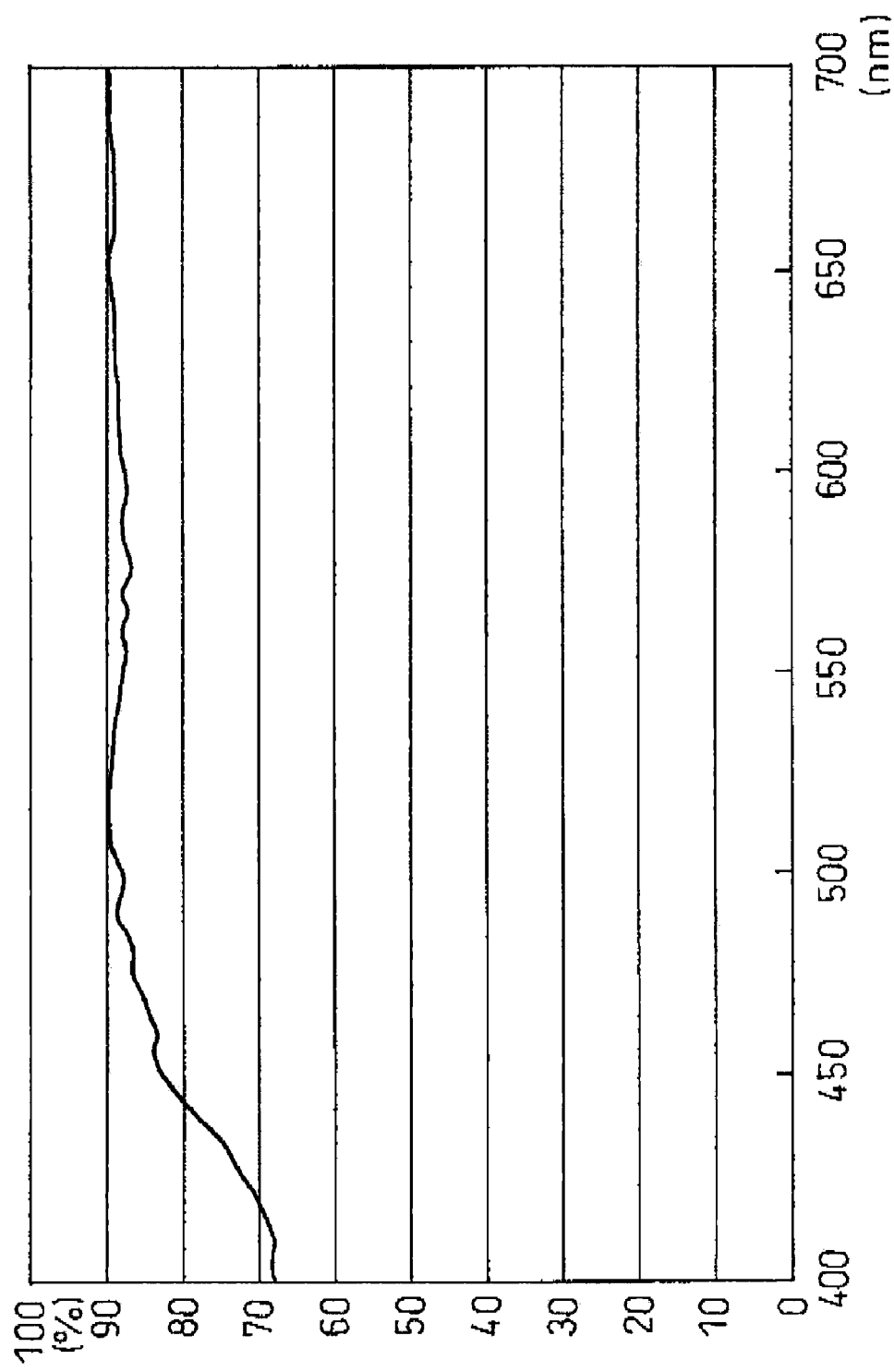
FIG. 7 is a diagram showing transmittance when the yellow pigmented ink used in the LED light source 20 is applied in a single layer.

FIG. 7 is a diagram showing transmittance when the yellow pigmented ink used in the LED light source 20 is applied in a single layer.

In FIG. 7, the abscissa represents the emission spectrum (nm), and the ordinate represents the transmittance (%).

The following description is given for the case where the chromaticity is adjusted so that the color temperature of the light emerging from the LED light source 20 becomes substantially equal to 5300 K over the emergence angle range of 0° to 60°. According to the data shown in Table 1, there is no need to adjust the chromaticity in the region 7c where the color temperature is already 5300 K. However, as the angle of emergence moves closer to the straight forward direction, the color temperature increases, and there arises a need to adjust the chromaticity. In this case, yellow pigment is applied in order to suppress the bluish tint of the light 6a emerging in the straight forward direction of the LED light source. As earlier described, to bring the color temperature in the region 7a closer to 5300 K, the two coating layers 9a and 9b are formed in the region 7a, while only one coating layer 9b is formed in the region 7b.

FIG. 8 is a graph showing the wavelengths of the light rays emerging from the LED light source 20 at various angles.

In FIG. 8, the abscissa represents the emission spectrum (nm), and the ordinate represents the ratio when the maximum value of the spectral radiant flux is set to 1. Solid line 21 in FIG. 8 is a graph (corresponding to the region 7a) normalized by setting to 1 the maximum value of the spectral radiant flux of the light emerging in the straight forward direction (the angle of emergence is 0°) before the coating layers 9a and 9b are formed. Dashed line 22 in FIG. 8 is a graph (corresponding to the region 7c) normalized by setting to 1 the maximum value of the spectral radiant flux of the light emerging at 60° relative to the straight forward direction. Line 23, with square marks, in FIG. 8 is a graph (corresponding to the region 7b) normalized by setting to 1 the maximum value of the spectral radiant flux of the light emerging at 45° relative to the straight forward direction after the coating layer 9b is formed. Line 24, with triangular marks, in FIG. 8 is a graph (corresponding to the region 7a) normalized by setting to 1 the maximum value of the spectral radiant flux of the light emerging in the straight forward direction (the angle of emergence is 0°) after the coating layers 9a and 9b are formed.

FIG. 9 is a diagram explaining how the chromaticity is adjusted in the LED light source 20.

In FIG. 9, the abscissa represents the position along the line BB' traversing the LED light source 20 in FIG. 6, and the origin corresponds to the position directly above the LED device 1. The ordinate in FIG. 9 represents the color temperature (K). By applying the pigmented ink to the respective regions 7a, 7b, and 7c, as described above, the color temperature profile 30 before the chromaticity adjustment can be corrected as shown by the post-adjustment color temperature profile 32.

That is, by forming the coating layers 9a and 9b of yellow pigment as shown in FIG. 6, the color temperature of the light emerging in the straight forward direction (the angle of emergence is 0°) is shifted to 5310 K, and thus the average color temperature of the emergent light over the emergence angle range of 0° to 45° is adjusted to 5300 K. In this way, the chromaticity can be adjusted so that the average color temperature of the emergent light is held within the range of about ±10 K of 5300 K over the emergence angle range of 0° to 60°.

The LED light source 10 shown in FIG. 1 has used the pigmented ink whose transmittance is low when applied in a single layer. In this way, the ratio of the coating area of the pigmented ink can be varied according to the transmittance, and various kinds of pigmented ink can be used.

In the LED light source 10 shown in FIG. 1, the ratio of the pigmented ink coating area has been varied from region to region. In contrast, the LED light source 20 shown in FIG. 6 uses the pigmented ink whose transmittance is high when applied. Then, the same effect as that of the LED light source 10 can be obtained by varying the kind of pigmented ink and the number of coatings while holding the ratio of the coating area constant for all the regions. It is also possible to vary the coating density gradually from region to region. Further, the regions to be coated with the pigmented ink need not necessarily be limited to the front face of the LED light source, but the side faces, etc., may be coated with the pigmented ink.

In the LED light source 10 shown in FIG. 1, cyan pigmented ink has been used to adjust the chromaticity, but the same effect can be obtained if blue pigmented ink is used.

FIG. 10 is a diagram explaining the basic principle of the chromaticity adjustment.

FIG. 10(a) shows a color temperature profile and a top view of an LED light source 40 when no pigmented ink whatsoever is applied to its surface. The LED light source 40 shown here corresponds to the condition before the chromaticity is adjusted in the above-described LED light source 10 or 20, and its resin surface is coated with no pigmented ink whatsoever. The color temperature profile 50 in the upper part of the figure represents the color temperatures measured along line CC' in the top view shown at the bottom, i.e., the color temperatures in the regions 7a, 7b, and 7c, respectively. The highest color temperature is measured at the position directly above the LED device 1, and is denoted by K1.

FIG. 10(b) shows a color temperature profile and a top view of an LED light source 41 when yellow pigmented ink is applied. The LED light source 41 shown here initially has a higher color temperature profile 51 than the color temperature profile 50 of the LED light source 40, and the yellow pigmented ink applied to the region 7c of the LED light source 10 is applied as shown in FIG. 10(b) (as shown by a circle 61). The color temperature profile in the upper part of the figure represents the color temperatures measured along line CC' in the top view shown at the bottom, i.e., the color temperatures in the regions 7a, 7b, and 7c, respectively. In this way, the initial color temperature profile 51 can be adjusted to the new color temperature profile 52, and thus the average color temperature of the LED light source 41 can be lowered and brought closer to the average color temperature of the LED light source 40.

FIG. 10(c) shows a color temperature profile and a top view of an LED light source 42 when cyan pigmented ink is applied. The LED light source 42 shown here initially has a lower color temperature profile 53 than the color temperature profile 50 of the LED light source 40, and the cyan pigmented ink applied to the region 7a of the LED light source 10 is applied as shown in FIG. 10(c) (as shown by a circle 62). In this way, the initial color temperature profile 53 can be adjusted to the new color temperature profile 54, and thus the average color temperature of the LED light source 42 can be raised and brought closer to the average color temperature of the LED light source 40.

In this way, by applying the cyan pigmented ink, yellow pigmented ink, etc. to suitable places, the color temperature profile can be varied as desired. Making adjustments so as to maintain the color temperature of the emergent light of the LED light source constant over a given emergence angle range (for example, 0° to 60°) is advantageous, for example, when making adjustments by customizing a single LED light source. Further, adjusting the color temperature as shown in FIG. 10 means, in a broad concept, adjusting the color temperature of the LED light source as a whole. This color temperature adjustment method is advantageous when adjusting the color temperature of any given LED light source to a suitable average color temperature in such cases as when the average color temperature varies among a plurality of LED light sources. Accordingly, the present application places the adjustment of the average color temperature as a subordinate concept to the chromaticity adjustment.

Next, a description will be given of how the chromaticity is adjusted by displacing the ink coating layer.

Figure 11:
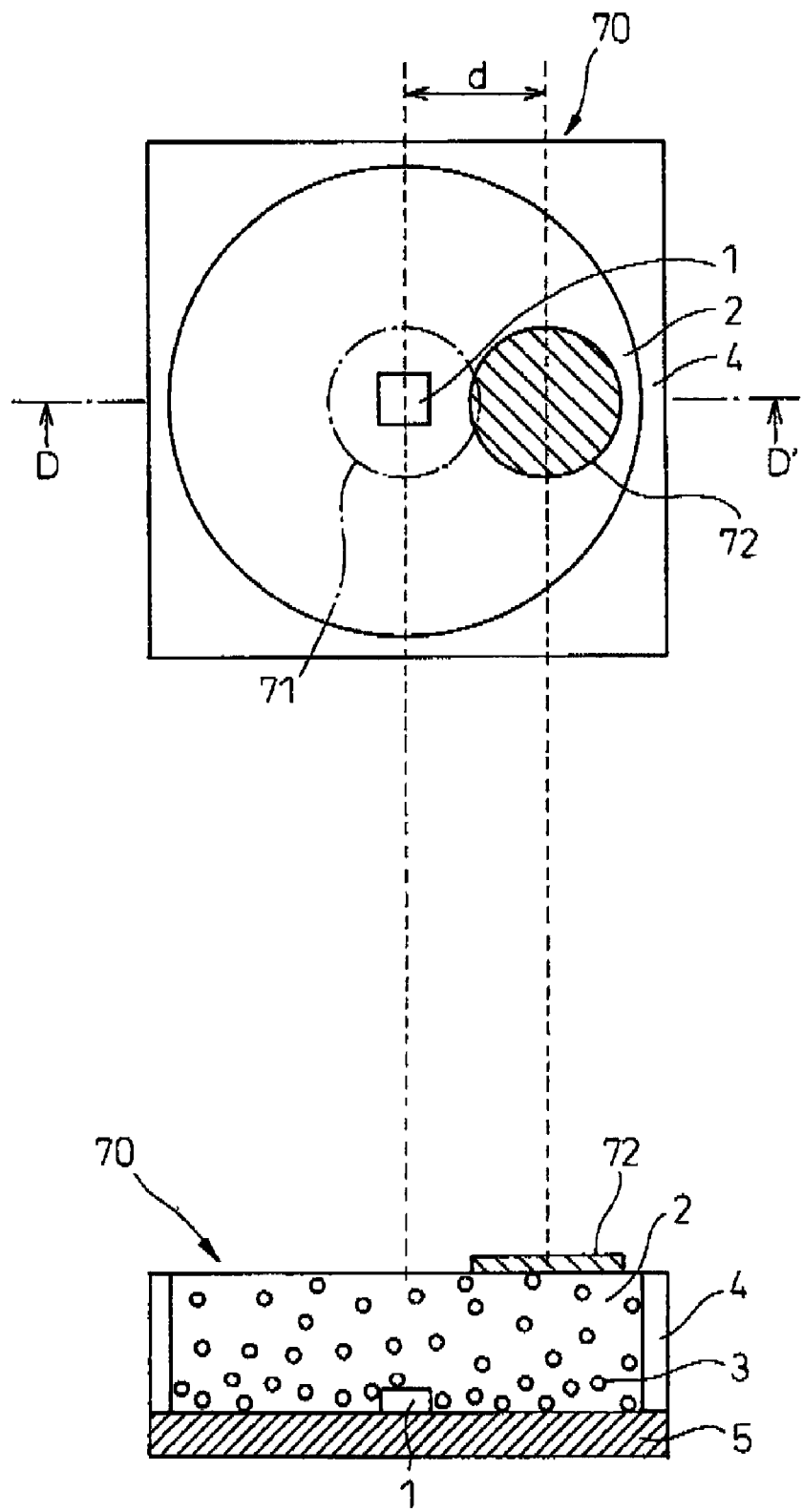
FIG. 11 is a diagram showing, by way of example, a top view and a cross-sectional view of still another LED light source 70 according to the present invention.

FIG. 11 is a diagram showing, by way of example, a top view and a cross-sectional view of still another LED light source 70 according to the present invention. The cross-sectional view shown at the bottom is a view taken along line DD' in the view shown thereabove (the top view of the LED light source 70).

In the LED light source 70, as shown in the top view of FIG. 11, a circular coating layer 72 of yellow pigmented ink is formed on the resin surface of the LED light source, that is, the LED light source 20 before the chromaticity adjustment, by being displaced from the center by a distance d. The yellow pigmented ink forming the coating layer 72 is the same ink that is used to form the coating layer 9a on the LED light source 20. A circular region 71 indicated by a semi-dashed line in the top view of FIG. 11 is the region corresponding to the position of the coating layer 9a formed on the LED light source 20. That is, in the LED light source 70 shown in FIG. 11, the coating layer 9a formed on the LED light source 20 shown in FIG. 6 is moved away from the LED device 1 by the distance d.

In the LED light source 70, the LED device 1 is constructed using a nitride-based compound semiconductor that emits blue light, and the phosphors 3 used here are cerium-activated yttrium aluminum garnet (YAG) phosphors. That is, the phosphors 3 absorb a portion of the light emitted from the LED device 1, and emit yellow light by wavelength conversion. The LED light source 70 thus creates white light for emission by mixing the blue light from the LED device 1 with the yellow light that the phosphors 3 emit when struck by the blue light from the LED device 1.

Figure 12:
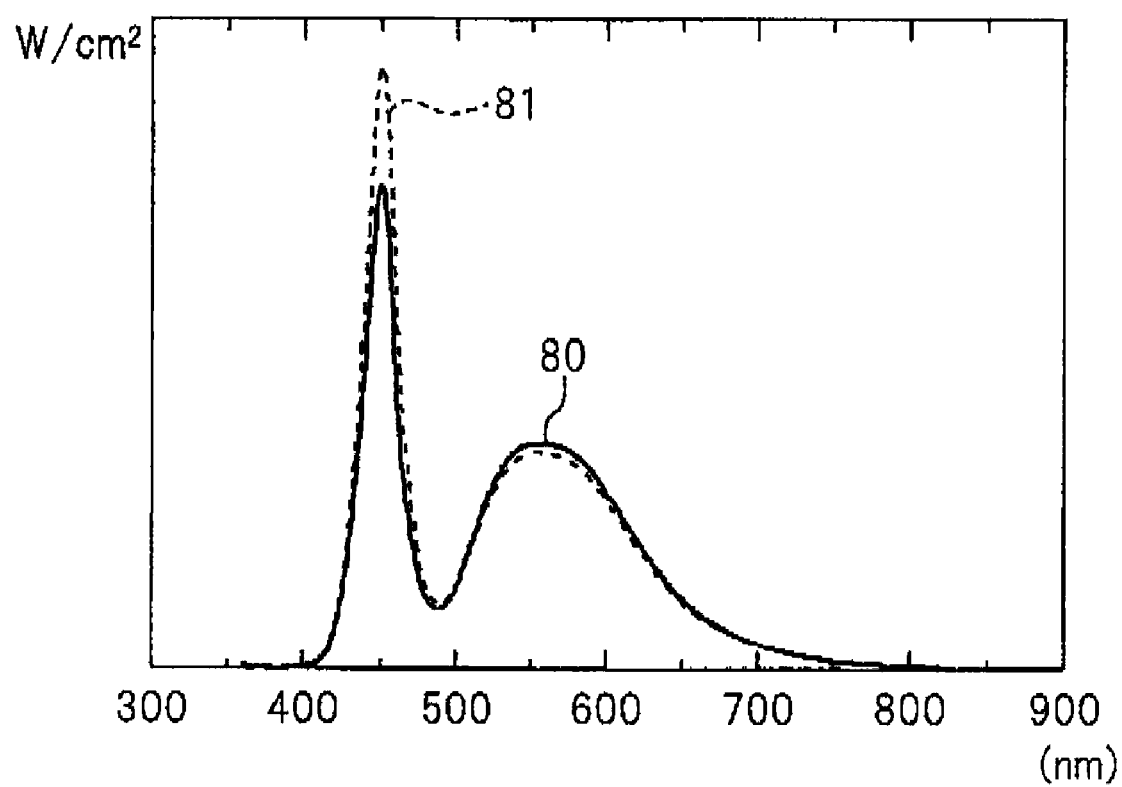
FIG. 12 is a diagram showing one example of the emission spectrum of the LED light source 70.

FIG. 12 is a diagram showing one example of the emission spectrum of the LED light source 70.

In FIG. 12, the abscissa represents the wavelength (nm) of the LED light source, and the ordinate represents the light intensity (W/cm$^2$). Further, in FIG. 12, dashed line 81 indicates the spectrum of the LED light source 70 before the coating layer 72 is formed, and solid line 80 indicates the spectrum of the LED light source 70 when the coating layer 72 is formed.

As is apparent from FIG. 12, when the chromaticity is adjusted by forming the coating layer 72, the spectrum of the LED light source 70 changes, and the peak occurring near 450 nm due to the blue LED decreases, while the peak occurring near 560 nm due to the yellow phosphor increases. That is, by forming the coating layer 72, the chromaticity coordinates of the LED light source 70 can be shifted toward the yellow region.

FIG. 13 is a diagram explaining how the coating layer is displaced.

Figure 13C:
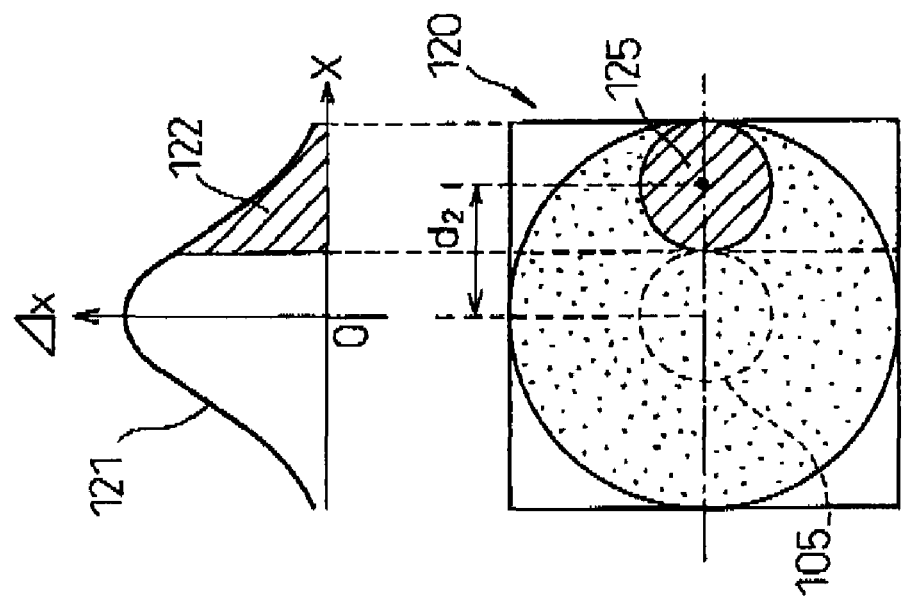
FIG. 13(c) shows a graph of the amount of chromaticity correction ($\Delta x$) in an LED light source 120 when a circular coating layer 125 is formed by being displaced from the position directly above the LED device 1 (not shown) by a distance d2, and a top view of the LED light source.
Figure 13B:
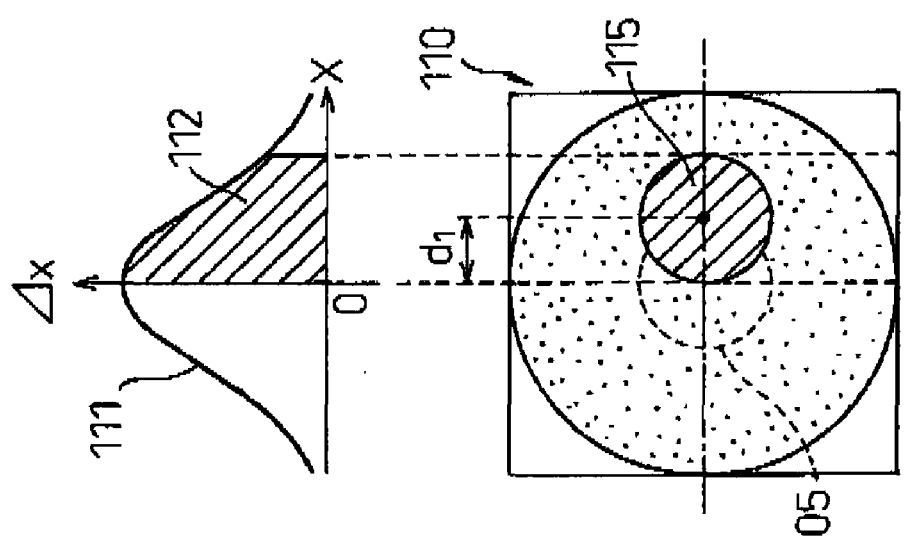
FIG. 13(b) shows a graph of the amount of chromaticity correction ($\Delta x$) in an LED light source 110 when a circular coating layer 115 is formed by being displaced from the position directly above the LED device 1 (not shown) by a distance d1, and a top view of the LED light source.
Figure 13A:
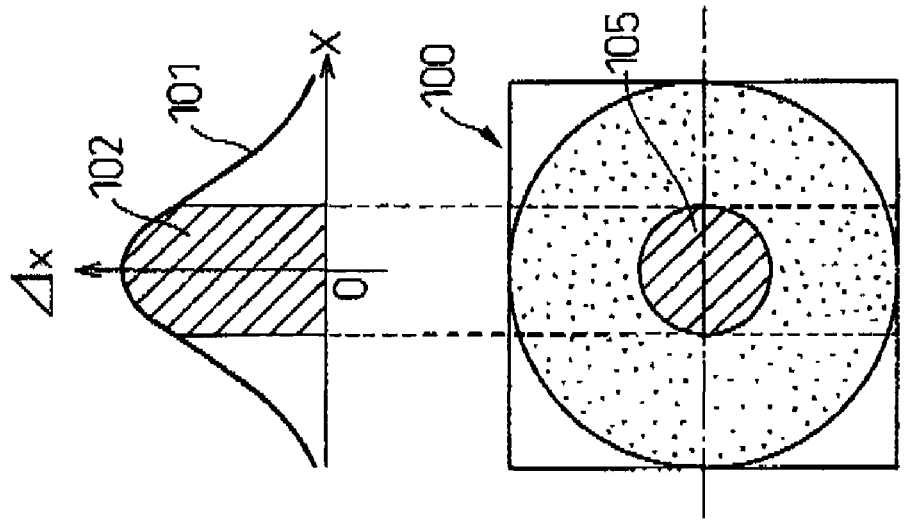
FIG. 13(a) shows a graph of the amount of chromaticity correction ($\Delta x$) in an LED light source 100 when a circular coating layer 105 is formed directly above an LED device 1 (not shown), and a top view of the LED light source.
Figure 16A:
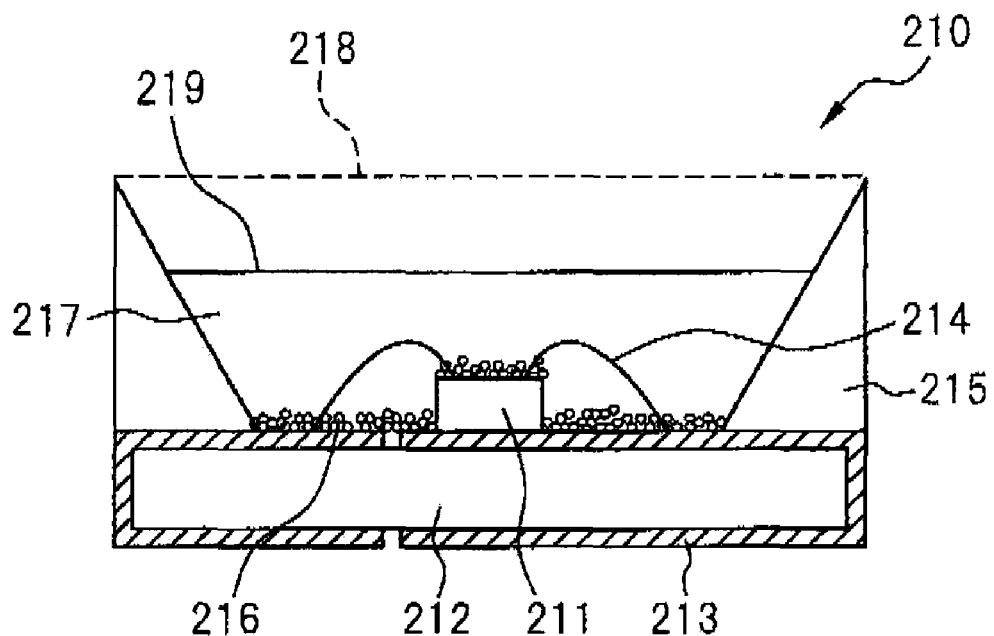
FIG. 16(a) is a cross-sectional view of a prior art LED light source in which the transparent resin in the upper part has been ground until target chromaticity is reached.
Figure 16B:
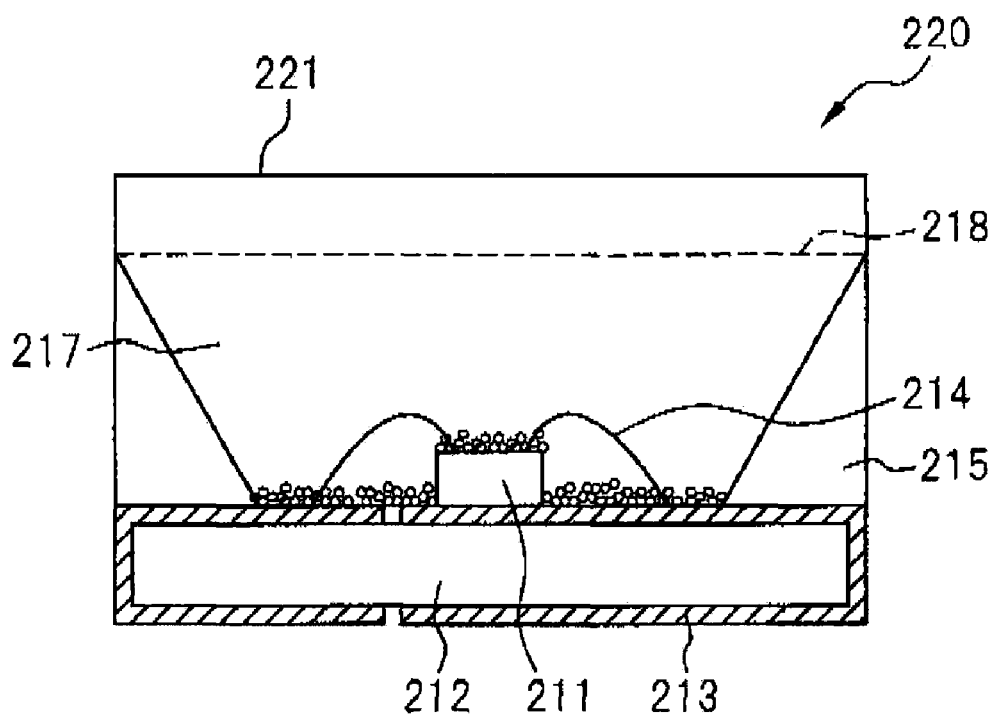
FIG. 16(b) is a cross-sectional view of another prior art LED light source in which the resin surface has been raised by further applying a resin over it.

FIG. 13(a) shows a graph of the amount of chromaticity correction (Δx) in an LED light source 100 when a circular coating layer 105 is formed directly above the LED device 1 (not shown), and a top view of the LED light source. The condition of the LED light source 100 before the formation of the coating layer 105 is the same as that of the previously described LED light source 20 before the formation of the coating layers 9a and 9b. Further, the ink used to form the coating layer 105 is the same yellow pigmented ink that is used to form the coating layer 9a on the LED light source 20.

By forming the coating layer 105 on the resin surface as shown in FIG. 13(a), the chromaticity of the emergent light from the LED light source 100 can be adjusted toward the yellow region in chromaticity coordinates. The amount of the chromaticity correction effected by the coating layer 105 is proportional to the area of a shaded portion 102 of the chromaticity correction profile 101.

FIG. 13(b) shows a graph of the amount of chromaticity correction (Δx) in an LED light source 110 when a circular coating layer 115 is formed by being displaced from the position directly above the LED device 1 (not shown) by a distance d1, and a top view of the LED light source. The condition of the LED light source 110 before the formation of the coating layer 115 is the same as that of the previously described LED light source 20 before the formation of the coating layers 9a and 9b. Further, the ink used to form the coating layer 115 is the same yellow pigmented ink that is used to form the coating layer 9a on the LED light source 20, and the coating layer 115 has the same shape and area as the coating layer 105 of FIG. 13(a).

By forming the coating layer 115 on the resin surface as shown in FIG. 13(b), the chromaticity of the emergent light from the LED light source 110 can be adjusted toward the yellow region in chromaticity coordinates. The amount of the chromaticity correction effected by the coating layer 115 is proportional to the area of a shaded portion 112 of the chromaticity correction profile 111.

FIG. 13(c) shows a graph of the amount of chromaticity correction (Δx) in an LED light source 120 when a circular coating layer 125 is formed by being displaced from the position directly above the LED device 1 (not shown) by a distance d2, and a top view of the LED light source. The condition of the LED light source 120 before the formation of the coating layer 125 is the same as that of the previously described LED light source 20 before the formation of the coating layers 9a and 9b. Further, the ink used to form the coating layer 125 is the same yellow pigmented ink that is used to form the coating layer 9a on the LED light source 20, and the coating layer 125 has the same shape and area as the coating layer 105 of FIG. 13(a).

By forming the coating layer 125 on the resin surface as shown in FIG. 13(c), the chromaticity of the emergent light from the LED light source 120 can be adjusted toward the yellow region in chromaticity coordinates. The amount of the chromaticity correction effected by the coating layer 125 is proportional to the area of a shaded portion 122 of the chromaticity correction profile 121.

As can be seen from FIGS. 13(a) to 13(c), by varying the amount of displacement (d) of the coating layer formed of the same yellow pigmented ink and having the same shape and area, the amount of chromaticity correction (that is, the amount of chromaticity adjustment) in the LED light source can be varied.

The chromaticity correction profiles shown in FIGS. 13(a) to 13(c) are obtained in the following procedure.

(1) A chromoscope is set in a fixed position directly above the LED device in the LED light source to be measured.

(2) A microscopic coating layer of the same yellow pigmented ink is formed on the resin surface of the LED light source, and the difference from the chromaticity measured when no such coating layer is formed is calculated as the amount of chromaticity correction.

(3) Microscopic coating layers of the same yellow pigmented ink are sequentially formed on the resin surface of the LED light source, and the amount of chromaticity correction is calculated each time the coating layer is formed.

(4) Based on all the calculation results, the chromaticity correction profile is obtained for the LED light source thus measured.

FIG. 14 is a diagram showing the relationship between the amount of displacement (d) and the amount of chromaticity correction Δx.

FIG. 14 is a plot of the data obtained by measuring the amount of chromaticity correction Δx while varying the amount of displacement (d) of the coating layer formed of the same yellow pigmented ink and having the same shape and area as the coating layer 9a of the LED light source 20 shown in FIG. 6. In FIG. 14, the abscissa represents the amount of displacement (d: μm), and the ordinate represents the amount of chromaticity correction Δx.

Dot 130 indicates the relationship when the amount of displacement d=0 μm, which corresponds to the LED light source 100 shown in FIG. 13(a). Dot 132 indicates the relationship when the amount of displacement d=d1=500 μm, which corresponds to the LED light source 110 shown in FIG. 13(b). Dot 134 indicates the relationship when the amount of displacement d=d2=1000 μm, which corresponds to the LED light source 120 shown in FIG. 13(c). Accordingly, it can be understood that there is a known correlation between the amount of displacement (d) and the amount of chromaticity correction Δx.

FIG. 15 is a diagram showing examples of chromaticity coordinates.

In FIG. 15, the abscissa and the ordinate represent chromaticity coordinate changes Δy and Δx, respectively. The chromaticity coordinate changes for the LED light source before the chromaticity adjustment (that is, when no coating layer is formed) are plotted at the origin (Δy, Δx)=(0, 0). That is, dot 135 corresponds to the LED light source 20 of FIG. 6 before the coating layers 9a and 9b are formed. Dots 130 to 134 in FIG. 15 correspond to the dots 130 to 134 in FIG. 14.

As can be seen from FIGS. 13 to 15, by varying the amount of displacement d of the coating layer of the same size formed by the same method, the degree of chromaticity adjustment can be corrected. That is, by forming the coating layers 105 to 125 as shown in FIGS. 13(a) to 13(c), the chromaticity of the emergent light from the LED light source can be adjusted as desired toward the yellow region in chromaticity coordinates.

When adjusting the chromaticity of the LED light source by displacing the ink coating layer as shown in FIGS. 13 to 15, first the LED light source with no coating layer formed thereon is operated to emit light, and the chromaticity of the emitted light is measured. Then, if the measured chromaticity does not match the desired chromaticity, the ink coating layer used for making the adjustment that matches the difference between the measured chromaticity and the desired chromaticity is displaced by a prescribed distance and disposed on the resin surface of the LED light source. The chromaticity difference and the amount of displacement (d) should be varied in accordance with the chromaticity difference while holding the shape and area of the ink coating layer constant. In this case, the relationship between the chromaticity difference and the amount of displacement is stored in the form of a table or the like, and based on the result of the measurement, the ink coating layer is disposed in accordance with the amount of displacement (d) defined in the table. The method in which the chromaticity is adjusted by displacing the position of the ink coating layer of the same shape and area, as described above, provides a means very effective in reducing the manufacturing cost of LED light sources whose chromaticity falls within a prescribed range.

In the above example, the ink coating layer containing the pigmented ink has been applied in a desired coating density onto the resin surface of the LED light source by using an inkjet printer. However, the method of applying the ink coating layer is not limited to the inkjet printing method, but other suitable method may be used. For example, a pigmented-ink-containing coating layer may be prepared in advance in the form of an adhesive seal, and this adhesive seal-like ink coating layer may be applied to the resin surface of the LED light source.

The above example has been described by taking as an example the LED light source constructed by combining a blue LED device with a phosphor that emits yellow color, but it will be recognized that the chromaticity can be adjusted in a similar manner if the LED light source is constructed by combining a blue LED device with two kinds of phosphors that emit green and red colors, respectively, or by combining an ultraviolet LED device with three kinds of phosphors that emit blue, green, and red colors, respectively.

Further, while the above example has been described for the case where the yellow pigmented ink is used (FIG. 1, b) in order to adjust the chromaticity by ingeniously disposing the ink coating layer on the surface of the transparent resin, it will be appreciated that the same effect as the present invention can be achieved if, for example, a YAG phosphor is used instead of the yellow pigmented ink.

According to the LED light source and the chromaticity adjustment method for the LED light source disclosed in the invention, the adjustment can be made so that the color temperature of the emergent light from the LED light source becomes uniform over a prescribed range. Furthermore, according to the LED light source and the chromaticity adjustment method for the LED light source disclosed in the invention, the chromaticity of the LED light source can be adjusted to the desired value. The invention can thus provide LED light sources free from variations.

What is claimed is:

1. A chromaticity adjustment method for an LED light source having an LED device, a phosphor which absorbs a portion of light emitted from said LED device and emits light by wavelength conversion, and a resin material containing said phosphor and disposed so as to enclose said LED device, comprising the step of disposing an ink coating layer on a surface of said resin material in order to adjust chromaticity.

2. The chromaticity adjustment method for the LED light source according to claim 1, wherein the step of disposing said ink coating layer includes dividing the surface of said resin material into a plurality of regions and disposing said ink coating layer in each region selected from among said plurality of regions, in order to correct color temperature of the light emerging from said LED light source.

3. The chromaticity adjustment method for the LED light source according to claim 2, wherein said ink coating layer disposed in said each region has a different ink coating density from each other.

4. The chromaticity adjustment method for the LED light source according to claim 2, wherein said ink coating layer disposed in said each region has a different ink coating area ratio from each other.

5. The chromaticity adjustment method for the LED light source according to claim 2, wherein said ink coating layer disposed in said each region comprises a different number of coatings from each other.

6. The chromaticity adjustment method for the LED light source according to claim 1, wherein the step of disposing said ink coating layer includes,
    measuring the chromaticity of the light emerging from said LED light source, and
    disposing said ink coating layer so as to be displaced along the surface of said resin material in accordance with said measured chromaticity.

7. The chromaticity adjustment method for the LED light source according to claim 6, wherein said LED device emits blue light, and said phosphor absorbs said blue light and emits yellow light, thereby creating white light to emerge from said LED light source, and
    said created white light emerging from said LED light source is adjusted toward a yellow region by said ink coating layer.

8. The chromaticity adjustment method for the LED light source according to claim 1, wherein said ink coating layer contains pigmented ink.

9. An LED light source comprising:
    an LED device;
    a phosphor which absorbs a portion of light emitted from said LED device and emits light by wavelength conversion;
    a resin material containing said phosphor and disposed so as to enclose said LED device; and
    an ink coating layer disposed on a surface of said resin material in order to adjust chromaticity.

10. The LED light source according to claim 9, wherein said ink coating layer is disposed in each region selected from among a plurality of regions created by dividing the surface of said resin material, in order to correct color temperature of the light emerging from said LED light source.

11. The LED light source according to claim 9, wherein said ink coating layer is disposed so as to be displaced along the surface of said resin material in accordance with the chromaticity measured of said LED light source.

12. The LED light source according to claim 9, wherein said ink coating layer contains pigmented ink.

* * * * *